US006347039B1

(12) United States Patent
Lee

(10) Patent No.: US 6,347,039 B1
(45) Date of Patent: Feb. 12, 2002

(54) MEMORY MODULE AND MEMORY MODULE SOCKET

(75) Inventor: Jung Joon Lee, Seoul (KR)

(73) Assignee: Samsung Electronics Co., Ltd., Kyungki-do (KR)

( * ) Notice: Subject to any disclaimer, the term of this patent is extended or adjusted under 35 U.S.C. 154(b) by 0 days.

(21) Appl. No.: 09/364,677

(22) Filed: Jul. 30, 1999

(30) Foreign Application Priority Data

Sep. 3, 1998 (KR) ............................................ 98-36217

(51) Int. Cl.$^7$ ................................................ H05K 1/18
(52) U.S. Cl. ...................... 361/760; 361/748; 361/765; 361/763; 361/785; 361/801; 174/262; 174/260; 174/250; 439/59-62; 228/180.21; 228/180.1
(58) Field of Search ................................. 361/760, 748, 361/790, 750, 801, 765, 763, 785; 257/686, 685, 777, 723, 724, 778; 174/262, 260, 250; 228/180.21, 180.1; 439/59–62

(56) References Cited

U.S. PATENT DOCUMENTS

| 4,603,928 | A | * | 8/1986 | Evans ........................... 439/61 |
| 5,412,538 | A | * | 5/1995 | Kikinis et al. ............... 361/792 |
| 5,818,698 | A | * | 8/1999 | Corisis ......................... 361/760 |
| 5,941,447 | A | * | 8/1999 | Chu et al. ............... 228/180.21 |
| 5,956,233 | A | * | 9/1999 | Yew et al. ................... 361/760 |
| 5,996,880 | A | * | 12/1999 | Chu et al. ............... 228/180.21 |
| 6,021,048 | A | * | 2/2000 | Smith .......................... 361/736 |
| 6,031,727 | A | * | 2/2000 | Duesman et al. ........... 361/761 |
| 6,038,132 | A | * | 3/2000 | Tokunaga et al. ........... 361/760 |
| 6,097,883 | A | * | 8/2000 | Dell et al. ................... 395/282 |

* cited by examiner

Primary Examiner—Leo P. Picard
Assistant Examiner—David Foster
(74) Attorney, Agent, or Firm—Skjerven Morrill MacPherson LLP; David W. Heid

(57) ABSTRACT

A memory module includes a plurality of semiconductor memory devices mounted on a printed wiring board (PWB); longitudinal contact terminals that are for connection to a computer mother board and are arranged along at least one longitudinal edge of the PWB; and transverse contact terminals that are for connection to the computer mother board and are arranged along at least one transverse edge of the PWB. A socket for the module includes at least one longitudinal part into which the longitudinal contact terminals are inserted and at least one transverse part into which the transverse contact terminals are inserted. Each transverse socket part can be mounted on a pivot attached to the longitudinal part and rotated to engage a PWB inserted in the longitudinal part. Alternatively, each transverse part can be a flexible circuit carrier.

9 Claims, 4 Drawing Sheets

MEMORY MODULE AND MEMORY MODULE SOCKET

BACKGROUND OF THE INVENTION

1. Field of the Invention

The present invention relates to a memory module for a computer and to a socket into which the memory module is inserted.

2. Description of the Related Arts

A computer that performs a highly complicated tasks such as manipulating a high resolution graphics typically requires a large memory capacity and a wide data bus. Thus, a memory module for the computer must include many contact terminals, through which a microprocessor communicates with the memory module. In addition, the memory module typically requires several contact terminals for power signals since high microprocessor speed makes the memory module susceptible to signal noise. The large number of the contact terminals makes the memory module large and prevents miniaturization of the computer.

A conventional memory module has multiple memory devices (or ICs) mounted on a printed wiring board (PWB), and the PWB has multiple contact terminals for power signals, control signals, address signals, or data signals from a mother board of a computer system. Typical memory module types include a SIMM (single in-line memory module) and a DIMM (dual in-line memory module). In both types, contact terminals are arranged along a bottom edge of the PWB on a front and back surfaces of the PWB. In the SIMM type, two opposite contact terminals that face each other across the PWB are for the same signal, but in the DIMM type, the two opposite contact terminals are designated for different signals.

FIGS. 1 and 4 respectively show a typical memory module and the module when inserted in a socket. The memory module has multiple semiconductor memory devices 3 mounted on a PWB 1, and contact terminals 5 are along a bottom edge of PWB 1. A socket 7, in which the memory module is inserted, is installed on a mother board of a computer. Socket 7 has contact terminals (not shown) for contacting respective contact terminals 5 of the memory module. The memory module communicates via socket 7 with a microprocessor and other control devices which may be mounted on the mother board. That is, power signals (Vcc, Vdd, Vss), control signals, address signals and data signals. are transferred between the memory module and the microprocessor and other devices via the contact terminals of socket 7.

In designing wiring patterns of the memory module, a short signal path from an external terminal of a semiconductor device to a corresponding contact terminal of the memory module is desirable. However, physical restrictions on the PWB make some signal paths 4a and 4b (FIG. 1) undesirably long. Moreover, when external terminals from different semiconductor devices mounted on different locations of the PWB connect to a common contact terminal of the memory module, the signal paths from the common contact terminal to respective semiconductor devices may differ. The long and uneven signal paths can cause signal noise, a signal delay and a clock skew that may result in a malfunctioning of the computer. Therefore, a way to design the signal paths of the memory module as short and even to one another as possible is needed.

SUMMARY OF THE INVENTION

In accordance with an embodiment of the present invention, a memory module includes contact terminals formed along at least one transverse (or side) edge as well as a longitudinal (or bottom) edge of the memory module. The addition of the contact terminals along transverse edges can promote an efficient wiring of a printed wiring board (PWB) for the memory module. The transverse contact terminals on the side of the memory module can be designated for any signals. For example, power lines (for Vcc or Vdd), ground lines (for GND or Vss), address lines, control lines through which memory module control signals pass, and any other lines can connect to the transverse contact terminals.

Another embodiment of the present invention provides a socket for the above-described memory module. The socket includes a horizontal portion, into which the bottom edge of the memory module inserts, and a vertical portion, into which a vertical edge of the memory module inserts. All contact terminals of the memory module contact respective contact terminals formed in the horizontal and vertical portions of the socket. The vertical portion can be made of a flexible circuit carrier or a connector head that rotatably attaches to the horizontal portion.

BRIEF DESCRIPTION OF THE DRAWINGS

The various features and advantages of the present invention are described in conjunction with the accompanying drawings, in which.

Use of the same reference symbols in different figures indicates similar or identical items.

DETAILED DESCRIPTION OF THE INVENTION

Figure 1:
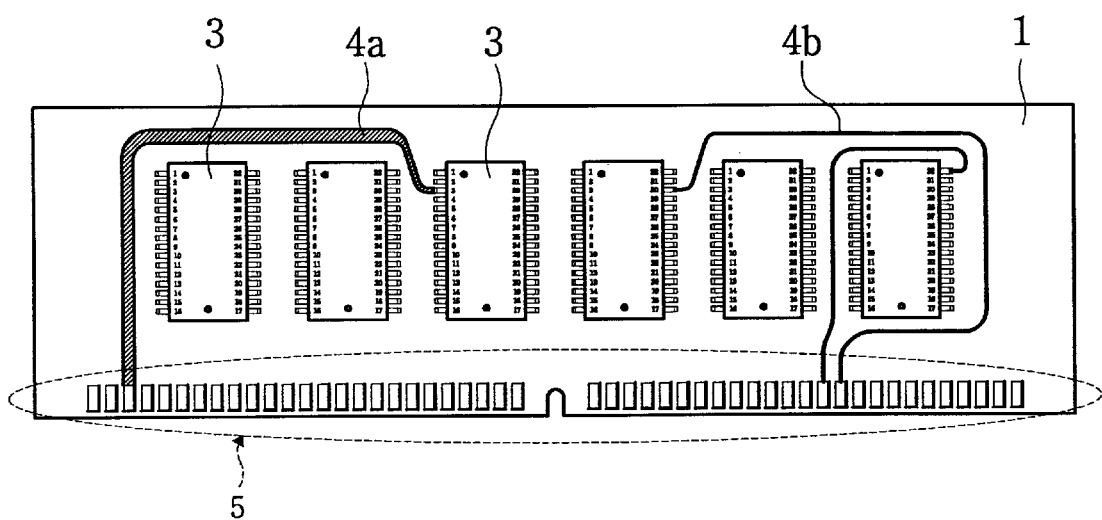
FIG. 1 is a plan view of a conventional memory module.
Figure 2:
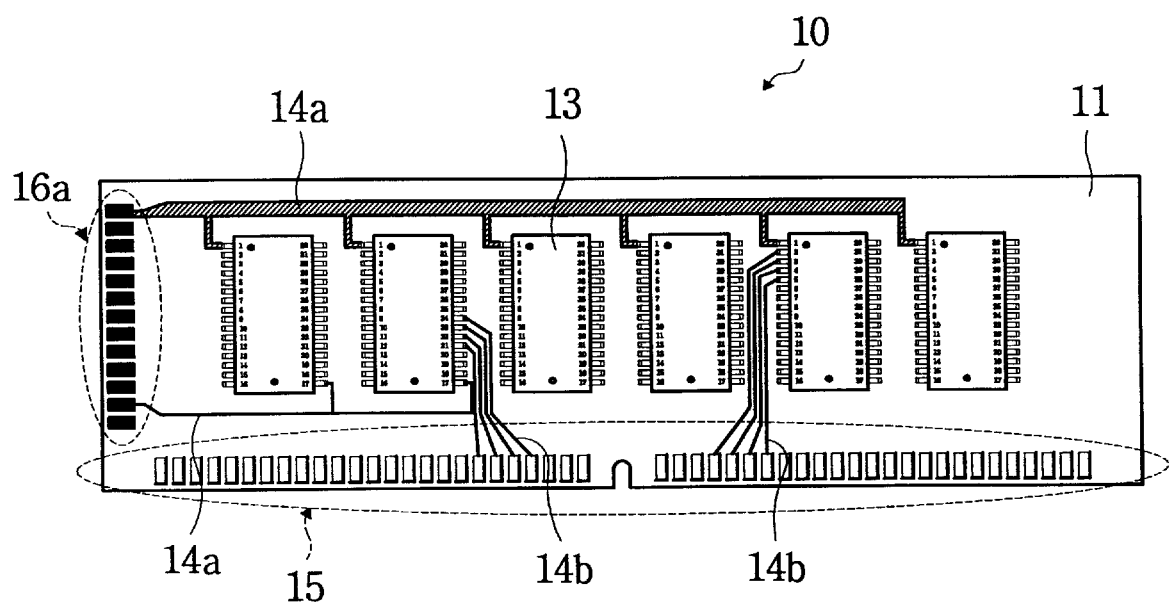
FIG. 2 is a plan view of a memory module according to an embodiment of the present invention.

FIG. 2 shows a memory module 10 in accordance with an embodiment of the present invention. Like the conventional memory module of FIG. 1, memory module 10 includes a printed wiring board (PWB) 11, memory devices 13 mounted on PWB 11, contact terminals 15 formed along a bottom edge of PWB 11 (or memory module 10), and wiring patterns (signal paths) 14a and 14b which electrically connect memory devices 13 to respective contact terminals 15. Contact terminals such as contact terminals 15 that are along a longitudinal edge are referred to herein as longitudinal contact terminals. Memory module 10 additionally includes contact terminals 16a formed along a transverse edge of PWB 11 (or memory module 10). Contact terminals such as contact terminals 16a that are along a transverse edge are referred to herein as transverse contact terminals. As shown in FIG. 2, the transverse and longitudinal edges of PWB are substantially perpendicular to each other. As described further below, contacts 16a and 15 being on perpendicular edges facilitates perpendicular wiring layers for reduction of cross talk. However, the angle between the edges can differ from 90° if desired. Wiring patterns 14a and 14b shown in FIG. 2 are only part of the full wiring pattern that connects longitudinal contact terminals 15 and transverse contact terminals 16a to memory devices 13.

Figure 3:
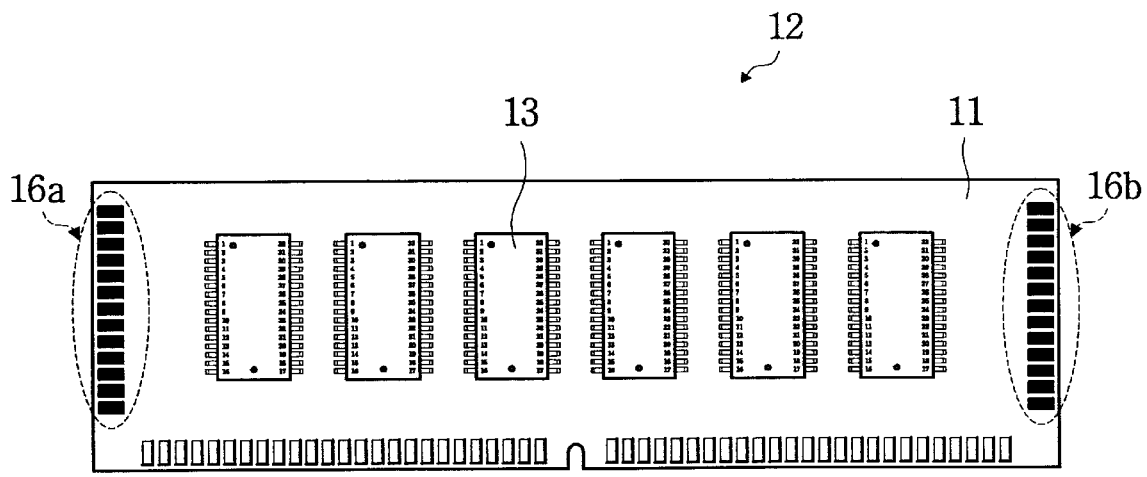
FIG. 3 is a plan view of a memory module according to another embodiment of the present invention.
Figure 4:
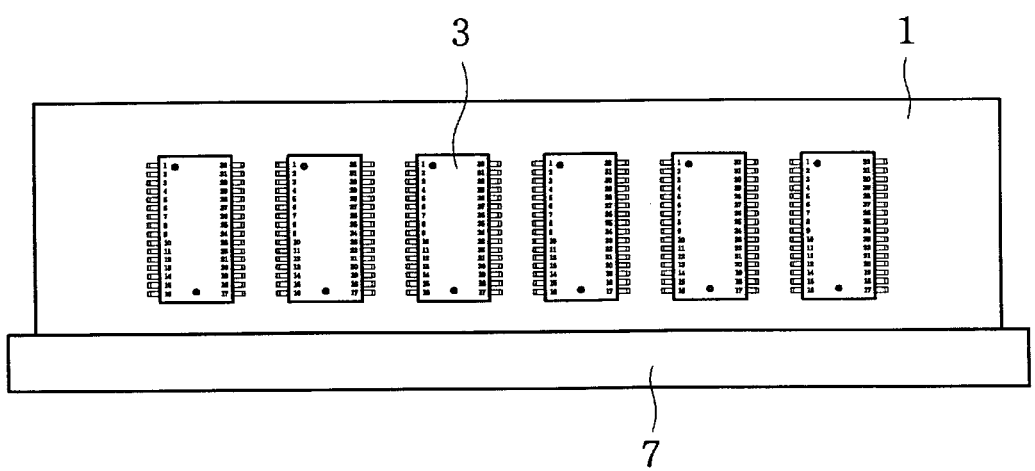
FIG. 4 shows a conventional memory module inserted in a conventional socket.

FIG. 3 shows a memory module 12 in accordance with another embodiment of the present invention. Memory module 12 is the same as memory module 10 except that memory module 12 has transverse contact terminals 16a and 16b along respective transverse edges of PWB 11 (or memory module 12) and the wiring pattern (not shown in FIG. 3) takes advantage of having transverse contact terminals available at both vertical edges. FIGS. 2 and 3 show only front sides of memory modules 10 and 12. The back sides of memory modules 10 and 12 may have contact terminals symmetrical to those on the front sides.

Wiring patterns 14a (FIG. 2) extend from transverse contact terminals 16a, and wiring patterns 14b extend from contact terminals 15 connect to memory devices 13. Contact terminals 15 and 16a can be designated for particular signals that simplify the design of wiring patterns 14a and 14b. For the efficient wiring, signal types can be classified into two groups. One group is assigned to transverse contact terminals 16a or 16b, and another group is assigned to longitudinal contact terminals 15. For example, all of the power-related lines (Vcc, Vdd, GND, etc.) can be assigned to transverse contact terminals 16a or 16b, and the remaining signals (control lines, address lines, data lines, etc.) can be assigned to longitudinal contact terminals 15. Alternatively, to juxtapose the address lines with other lines, the address signals can be assigned to transverse contact terminals 16a or 16b, and the remaining lines can be assigned to longitudinal contact terminals 15. Having contact terminals of both transverse and longitudinal edges provides additional freedom in wiring design that allows designers to choose a proper writing pattern based on the memory module types or pin configurations.

Memory modules 10 and 12 can include multiple layers of wiring for wiring patterns 14a and 14b. In designing memory modules 10 and 12, the wiring patterns on each layer preferably run perpendicularly to the wiring patterns on the next layer to reduce a cross-talk between the wiring patterns of two adjacent layers. Transverse contact terminals 16a and 16b facilitate perpendicular wiring pattern design.

Figure 5A:
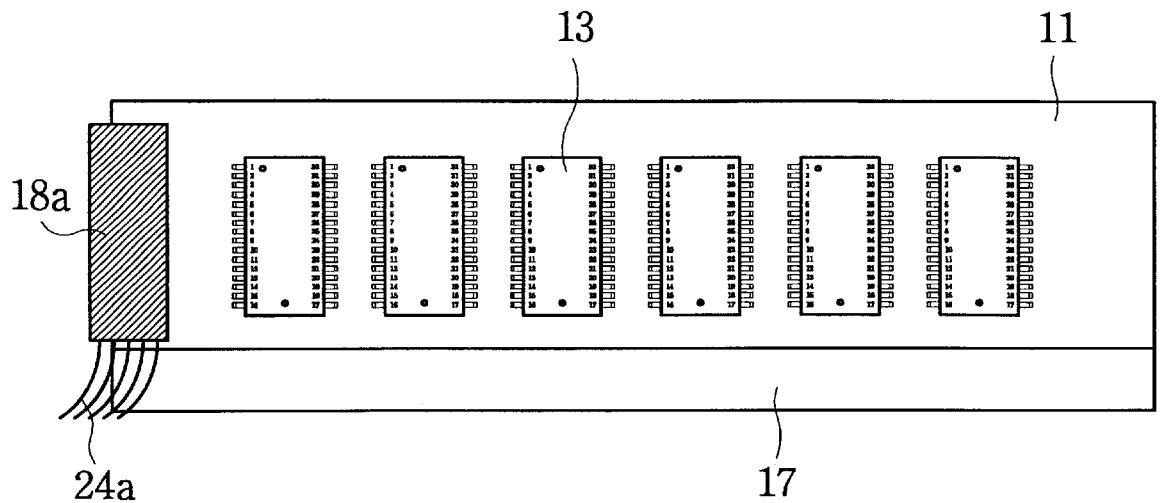
FIG. 5A shows the memory module of FIG. 2 inserted in a socket according to an embodiment of the present invention.
Figure 5B:
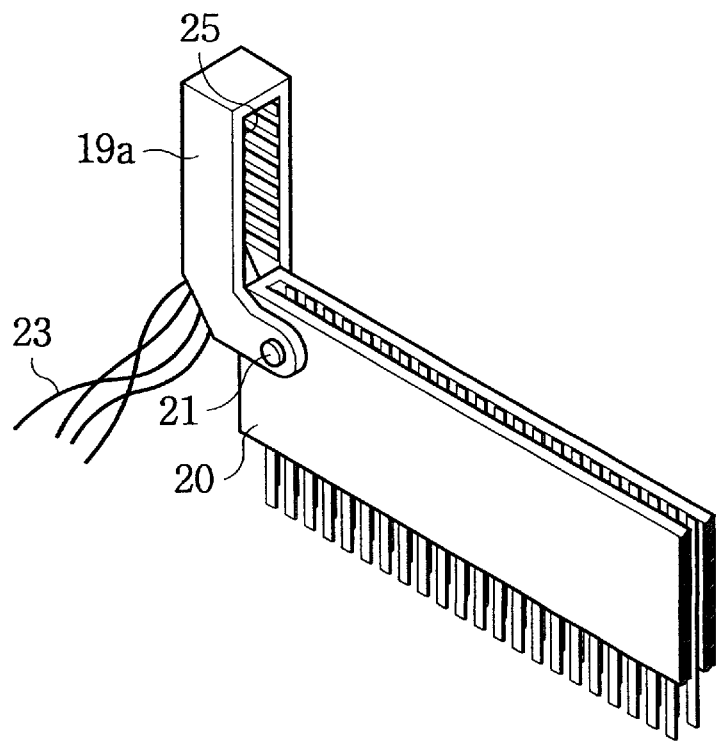
FIG. 5B is a perspective view of a socket according to another embodiment of the present invention.

Another aspect of the invention provides sockets for memory modules 10 and 12. FIGS. 5A and 5B illustrate sockets for memory module 10. Each of these sockets includes a horizontal portion into which longitudinal contact terminals 15 insert and a vertical portion into which transverse contact terminals 16a insert. The socket of FIG. 5A includes a horizontal portion 17, which is identical to a conventional socket such as a conventional SIMM connector, and a vertical portion 18a formed of a flexible circuit carrier. The socket of FIG. 5B includes a horizontal portion 20 and a vertical portion 19a which is attached to a pivot 21 at an end of horizontal portion 20 so that vertical portion 19a can rotate about pivot 21.

Referring to FIGS. 2 and 5A, the flexible circuit carrier (vertical portion 18a), also known as a flexible cable or a flexible PWB, is a thin insulating tape on which copper patterns (not shown) and contact terminals (not shown) are formed. Flexible PWBs are widely used as connecting media in small electronic appliances. Wirings 24a electrically connect the flexible circuit carrier to a mother board. In inserting memory module 10, contact terminals 15 are inserted to horizontal portion 17 mounted on the mother board, so that contact terminals 15 contact the contact terminals inside horizontal portion 17. Then, vertical portion 18a is pushed onto PWB 11 so that contact terminals 16a are inserted into vertical portion 18a.

Referring to FIG. 5B, a shaft pin or pivot 21 rotatably fixes vertical portion 19a to one end of horizontal portion 20. Wirings 23 electrically connect contact terminals 25 of vertical portion 19a to the mother board on which horizontal portion 20 is mounted. In inserting memory module 10, vertical portion 19a is rotated out of the way, and contact terminals 15 are inserted to horizontal portion 20 so that contact terminals 15 contact the contact terminals inside horizontal portion 20. Then, rotating vertical portion 19a about pivot 21 engages vertical portion 19a with transverse contacts 16a of PWB 10. At inner walls of portion 19a, terminals 25 contact transverse contact terminals 16a of PWB 11. A cable harness 23 connects terminals 25 to the computer mother board.

Figure 6A:
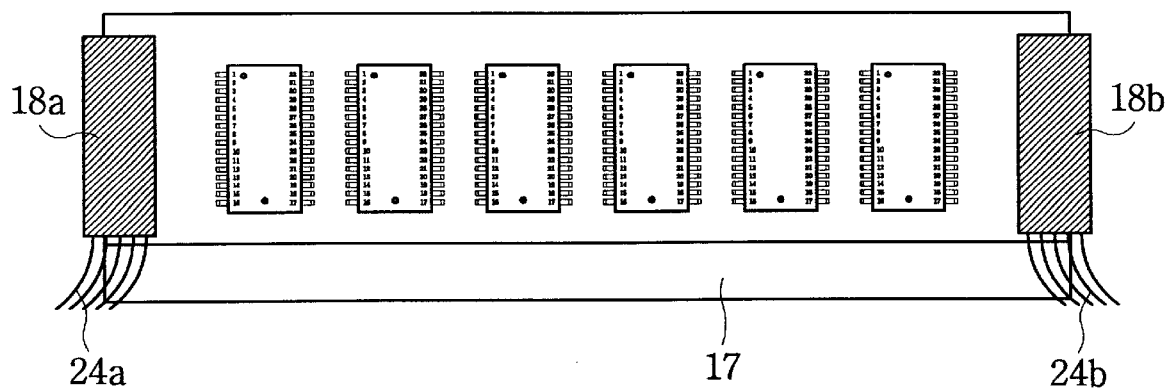
FIG. 6A shows the memory module of FIG. 3 inserted in a socket according to another embodiment of the present invention.
Figure 6B:
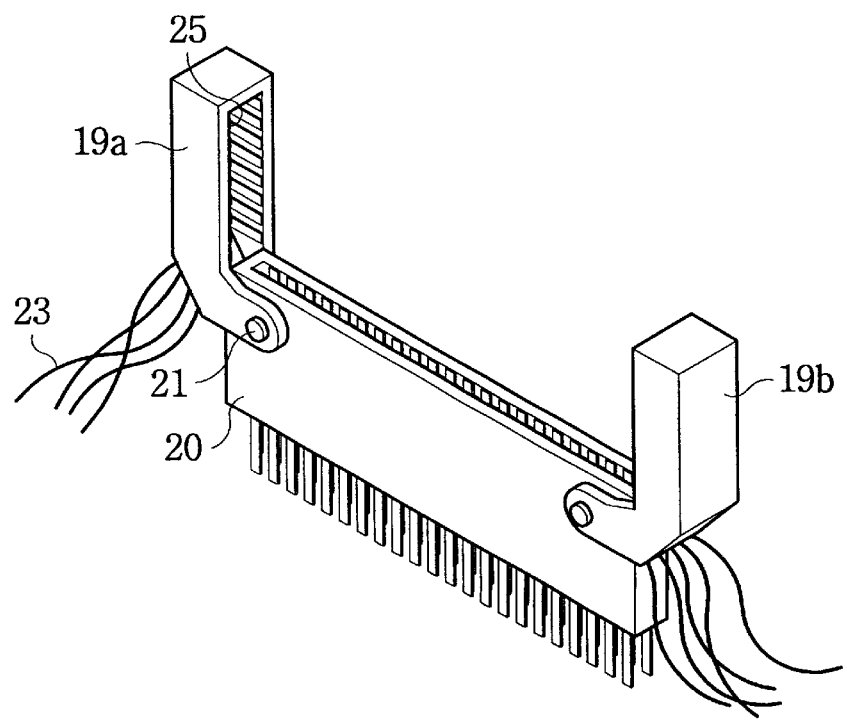
FIG. 6B is a perspective view of a socket according to another embodiment of the present invention.

FIGS. 6A and 6B show sockets for memory module 12 of FIG. 3. The sockets of FIGS. 6A and 6B are similar to those of FIGS. 5A and 5B except for respective extra vertical portions 18b and 19b. Thus, insertion of memory module 12 to the sockets of FIGS. 6A and 6B is similar to the memory module insertion described with reference to FIGS. 5A and 5B. In particular, for the socket of FIG. 6A, memory module 12 is inserted in horizontal socket 17, and vertical portions 18a and 18b are attached to the transverse sides of memory module 12. For the socket of FIG. 6B, an insertion method rotates vertical portions 19a and 19b out of the way, inserts memory module 12 in horizontal portion 20, and rotates vertical portions 19a and 19b up to engage transverse contacts 16a and 16b, respectively.

As described above, by forming contact terminals along a vertical edge of a memory module, embodiments of the present invention can increase the total number of contact terminals of the memory module without increasing the memory module size, and thus, prevents a mother board from becoming larger as the number of the contact terminals of the memory module increases. In addition, the wiring patterns of the memory module can be efficiently designed to avoid electrical problems such as signal noise, signal delay and cross-talk that can degrade the performance of a computer.

The PWB pattern has greater flexibility because signal lines can be assigned to the longitudinal contact terminals and to the transverse contact terminals. In a conventional module PWB having only longitudinal contact terminals, wiring lengths are difficult to minimize. However, according to the present invention, since common lines, address lines and data lines can be assigned independently to the transverse contact terminals, wiring becomes simpler and crosstalk and reflective waves, which occur in conventional memory modules, are reduced. This suppresses signal distortion and noise generation, so that electromagnetic immunity is better.

Further, mother boards can be smaller because a memory module occupies less space on the mother board. Thus, the production cost of a computer system is reduced, and productivity can be improved. Even when using the same size mother board, the smaller memory modules allow enough room for additional memory modules or controllers, and memory capacity of the system is greater.

Although the invention has been described with reference to particular embodiments, the description is only an example of the inventor's application and should not be taken as a limitation. Various adaptations and combinations of features of the embodiments disclosed are within the scope of the invention as defined by the following claims. For example, the invention is applicable to a module that includes any semiconductor devices.

What is claimed is:

1. A memory module comprising:
   a plurality of semiconductor memory devices mounted on a printed wiring board (PWB),
   a plurality of first contact terminals arranged along a longitudinal edge of the PWB, and
   a plurality of second contact terminals arranged along a transverse edge of the PWB; and
   a plurality of third contact terminals formed on a back surface of the printed wiring board along the longitudinal edge of the printed wiring board.

2. The module of claim 1, wherein the second contact terminals are designated for power signals and ground signals.

3. The module of claim 1, wherein the second contact terminals are designated for address signals.

4. The module of claim 1, wherein the second contact terminals are designated for control signals.

5. The module of claim 1, further comprising:
   a plurality of fourth contact terminals formed on the back surface of the printed wiring board along the transverse edge of the printed wiring board.

6. A socket for a memory module, comprising:
   a first portion into which a longitudinal edge of the module is inserted, the first portion including terminals that make contact with a first set of contact terminals that are on the longitudinal edge of the module; and
   a second portion into which a transverse edge of the module is inserted, the second portion including terminals that make contact with a second set of contact terminals that are on the transverse edge of the module,
   wherein the second portion is a flexible circuit carrier.

7. A socket for a memory module, comprising:
   a first portion into which a longitudinal edge of the module is inserted, the first portion including terminals that make contact with a first set of contact terminals that are on the longitudinal edge of the module; and
   a second portion into which a transverse edge of the module is inserted, the second portion including terminals that make contact with a second set of contact terminals that are on the transverse edge of the module,
   wherein the second portion is rotatably attached to one end of the first portion, so that the second portion can rotate about the end.

8. A memory module comprising:
   a plurality of semiconductor memory devices mounted on a printed wiring board (PWB),
   a plurality of first contact terminals arranged along a longitudinal edge of the PWB, and
   a plurality of second contact terminals arranged along a transverse edge of the PWB; and
   a plurality of third contact terminals formed on a back surface of the printed wiring board along the transverse edge of the printed wiring board.

9. The module of claim 8, further comprising: a plurality of fourth contact terminals formed on the back surface of the printed wiring board along the longitudinal edge of the printed wiring board.

* * * * *